US010553713B2

(12) United States Patent
Nakano

(10) Patent No.: US 10,553,713 B2
(45) Date of Patent: Feb. 4, 2020

(54) SEMICONDUCTOR DEVICE

(71) Applicant: ROHM CO., LTD., Kyoto-shi, Kyoto (JP)

(72) Inventor: Yuki Nakano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/286,055

(22) Filed: Oct. 5, 2016

(65) Prior Publication Data

US 2017/0025529 A1 Jan. 26, 2017

Related U.S. Application Data

(62) Division of application No. 14/362,016, filed as application No. PCT/JP2012/081028 on Nov. 30, 2012, now Pat. No. 9,496,384.

(30) Foreign Application Priority Data

Nov. 30, 2011 (JP) ................................. 2011-263035

(51) Int. Cl.
*H01L 29/772* (2006.01)
*H01L 29/78* (2006.01)
(Continued)

(52) U.S. Cl.
CPC ...... *H01L 29/7813* (2013.01); *H01L 29/0623* (2013.01); *H01L 29/0634* (2013.01);
(Continued)

(58) Field of Classification Search
CPC ........... H01L 29/66704; H01L 29/1037; H01L 29/7813; H01L 29/7825; H01L 29/4236;
(Continued)

(56) References Cited

U.S. PATENT DOCUMENTS 5,856,692 A 1/1999 Williams et al.
5,998,836 A 12/1999 Williams
(Continued)

FOREIGN PATENT DOCUMENTS

JP 09102607 4/1997
JP 09246546 9/1997
(Continued)

OTHER PUBLICATIONS

WO 2012/105611 A1, published Aug. 9, 2012.*
(Continued)

*Primary Examiner* — Daniel Whalen
*Assistant Examiner* — Suberr Chi
(74) *Attorney, Agent, or Firm* — Hamre, Schumann, Mueller & Larson, P.C.

(57) ABSTRACT

The present invention provides a semiconductor device that can achieve both low on-resistance and high withstand voltage, while reducing the device size, improving the manufacturing yield, and reducing the cost. The semiconductor device 1 includes a substrate 5, an epitaxial layer 6 formed on the substrate 5 and formed with a gate trench 11, a gate insulating film 17 formed on the side surface 14 and the bottom surface 15 of the gate trench 11, a gate electrode 20 embedded in the gate trench 11 and opposed to the epitaxial layer 6 with the gate insulating film 17 therebetween, and a source layer 25, a channel layer 26, and a drift layer 27 formed in this order from a first surface to a second surface of the epitaxial layer 6, in which the on-resistance $R_{on}$ represented by a variable "y" and the withstand voltage $V_b$ represented by a variable "x" functionally satisfy the following relational expression (1):

$$y \leq 9 \times 10^{-7} x^2 - 0.0004 x + 0.7001 \qquad (1).$$

9 Claims, 9 Drawing Sheets

(51) Int. Cl.
  *H01L 29/417* (2006.01)
  *H01L 29/06* (2006.01)
  *H01L 29/16* (2006.01)
  *H01L 29/10* (2006.01)
  *H01L 29/423* (2006.01)
  *H01L 29/08* (2006.01)
  *H01L 29/04* (2006.01)

(52) U.S. Cl.
  CPC ...... *H01L 29/0865* (2013.01); *H01L 29/1033* (2013.01); *H01L 29/1079* (2013.01); *H01L 29/1095* (2013.01); *H01L 29/1608* (2013.01); *H01L 29/41766* (2013.01); *H01L 29/4236* (2013.01); *H01L 29/045* (2013.01)

(58) Field of Classification Search
  CPC ......... H01L 29/42336; H01L 29/42352; H01L 29/7833–7836; H01L 29/1608
  See application file for complete search history.

(56) References Cited

U.S. PATENT DOCUMENTS

| | | |
|---|---|---|
| 5,998,837 A | 12/1999 | Williams |
| 6,049,108 A | 4/2000 | Williams et al. |
| 6,078,090 A | 6/2000 | Williams et al. |
| 6,097,063 A | 8/2000 | Fujihira |
| 6,140,678 A | 10/2000 | Grabowski et al. |
| 6,204,533 B1 | 3/2001 | Williams et al. |
| 6,291,856 B1 | 9/2001 | Miyasaka et al. |
| 6,342,709 B1 | 1/2002 | Sugawara et al. |
| 6,849,880 B1 | 2/2005 | Saito et al. |
| 2004/0021174 A1 | 2/2004 | Kobayashi |
| 2004/0195618 A1 | 10/2004 | Saito et al. |
| 2005/0247957 A1 | 11/2005 | Ninomiya |
| 2010/0006861 A1 | 1/2010 | Yamamoto et al. |
| 2010/0193799 A1 | 8/2010 | Nakano et al. |
| 2011/0017998 A1 | 1/2011 | Nakano et al. |
| 2011/0024831 A1 | 2/2011 | Nakano |
| 2011/0260243 A1 | 10/2011 | Saito et al. |
| 2012/0261676 A1 | 10/2012 | Nakano |
| 2013/0313576 A1* | 11/2013 | Nakano ............... H01L 29/1608 257/77 |
| 2015/0129893 A1 | 5/2015 | Nakano |

FOREIGN PATENT DOCUMENTS

| | | |
|---|---|---|
| JP | 09266311 | 10/1997 |
| JP | 1098188 | 4/1998 |
| JP | 2001111041 | 4/2001 |
| JP | 2003318396 | 11/2003 |
| JP | 2004311716 | 11/2004 |
| JP | 2005085990 | 3/2005 |
| JP | 2005322723 | 11/2005 |
| JP | 2007242797 | 9/2007 |
| JP | 2009260253 | 11/2009 |
| JP | 2011100967 | 5/2011 |
| JP | 2011119425 | 6/2011 |
| JP | 2011134910 | 7/2011 |
| JP | 2011233701 | 11/2011 |
| JP | 2013115385 | 6/2013 |

OTHER PUBLICATIONS

Office Action issued for corresponding Japanese Patent Application No. 2016-033564, dated Jan. 26, 2017, 13 pages including English translation.

* cited by examiner

SEMICONDUCTOR DEVICE

TECHNICAL FIELD

The present invention relates to an SiC semiconductor device having a trench-gate structure.

BACKGROUND ART

Semiconductor power devices have conventionally become the focus of attention, which are mainly used for systems in various power electronics fields such as motor control systems and power conversion systems.

As semiconductor power devices of this type, SiC semiconductor devices having a trench-gate structure have been proposed, for example.

For example, Patent Document 1 discloses a field effect transistor including an $n^+$-type SiC substrate, an $n^-$-type epitaxial layer (drift region) formed on the SiC substrate, a p-type body region formed in a surficial portion of the epitaxial layer, an $n^+$-type source region formed in a surficial portion within the body region, a gate trench formed in a manner penetrating through the source region and the body region to reach the drift region, a gate insulating film formed on the inner surface of the gate trench, and a gate electrode embedded in the gate trench.

PRIOR ART DOCUMENT

Patent Document

Patent Document 1: Japanese Patent Application Publication No. 2011-134910

SUMMARY OF THE INVENTION

It is an object of the present invention to provide a semiconductor device having both a low on-resistance and a high withstand voltage as well as achieving size reduction of the device, manufacturing yield improvement, and cost reduction.

Means for Solving the Problems

The present invention is directed to a semiconductor device including a first conductive-type SiC substrate, a first conductive-type SiC epitaxial layer formed on the substrate and formed with a gate trench, a gate insulating film formed on the side surface and the bottom surface of the gate trench, a gate electrode embedded in the gate trench and opposed to the epitaxial layer with the gate insulating film therebetween, a first conductive-type source layer formed in a manner exposed on a first surface of the epitaxial layer to define a portion of the side surface of the gate trench, a second conductive-type channel layer formed in a manner contacting the side of the source layer nearer to a second surface of the epitaxial layer to define a portion of the side surface of the gate trench, and a first conductive-type drift layer formed in a manner contacting the side of the channel layer nearer to the second surface of the epitaxial layer to define the bottom surface of the gate trench, in which the on-resistance $R_{on}$ represented by a variable "y" and the withstand voltage $V_b$ represented by a variable "x" functionally satisfy the following relational expression (1) (Aspect 1).

$$y \leq 9 \times 10^{-7} x^2 - 0.0004x + 0.7001 \quad (1)$$

In accordance with the semiconductor device according to the present invention, the on-resistance $R_{on}$ (mΩ·cm$^2$) represented by a variable "y" and the withstand voltage $V_b$ (V) represented by a variable "x" functionally satisfy the above relational expression (1), whereby it is possible to achieve both reduction in the on-resistance $R_{on}$ and increase in the withstand voltage $V_b$, which have conventionally been in a trade-off relationship.

This makes it possible, in production of products having the same resistance (on-resistance $R_{on}$) as conventional ones, to ensure a sufficient withstand voltage while reducing the active area of the substrate and/or the epitaxial layer to thereby reduce the size of the device and therefore the size of a semiconductor module including the semiconductor device according to the present invention. As a result, the number of chips which can be obtained from one substrate can be increased, resulting in an improvement in the manufacturing yield and therefore a reduction in the manufacturing cost can be achieved.

On the other hand, in production of semiconductor devices having the same active area as conventional ones, the on-resistance $R_{on}$ can be reduced relative to conventional ones, resulting in an improvement in the current capacity.

In the semiconductor device according to the present invention, if in the epitaxial layer, a channel with a mobility of, for example, 11 cm$^2$/Vs or higher is formed in the channel layer, the substrate preferably has a thickness of 100 μm or less (Aspect 2).

In such an SiC semiconductor device having a trench-gate structure as described in the present invention, the resistance of the substrate accounts for about 15 to 25% of the on-resistance $R_{on}$. The substrate having a thickness of 100 μm or less can therefore result in an effectively reduced on-resistance $R_{on}$. Accordingly, the channel is only required to have a mobility of 11 cm$^2$/Vs or higher, if increased to reduce the channel resistance, which allows the epitaxial layer to have a relatively large thickness and/or a low impurity concentration. It is therefore possible to achieve a higher withstand voltage.

In the semiconductor device according to the present invention, the on-resistance $R_{on}$ and the withstand voltage $V_b$ preferably satisfy the following relational expression (2) (Aspect 3).

$$y \leq 9 \times 10^{-7} x^2 - 0.0004x + 0.6984 \quad (2)$$

In this arrangement, if in the epitaxial layer, a channel with a mobility of, for example, 50 cm$^2$/Vs or higher is formed in the channel layer, the substrate may have a thickness of 250 μm or less (Aspect 4).

The channel having a mobility of 50 cm$^2$/Vs or higher can result in a sufficiently reduced channel resistance. Accordingly, the substrate is only required to have a thickness of 250 μm or less, if thinned to reduce the substrate resistance, which allows the substrate to have a practical sufficient strength. As a result, the substrate can be handled and diced efficiently in the process of manufacturing the semiconductor device.

In the semiconductor device according to the present invention, the on-resistance $R_{on}$ and the withstand voltage $V_b$ more preferably satisfy the following relational expression (3) (Aspect 5).

$$y \leq 9 \times 10^{-7} x^2 - 0.0004x + 0.4434 \quad (3)$$

In this arrangement, if in the epitaxial layer, a channel with a mobility of, for example, 50 cm$^2$/Vs or higher is formed in the channel layer, the substrate preferably has a thickness of 100 μm or less (Aspect 6).

The present invention is also directed to a semiconductor device including a first conductive-type SiC substrate, a first conductive-type SiC epitaxial layer formed on the substrate and formed with a gate trench, a gate insulating film formed on the side surface and the bottom surface of the gate trench, a gate electrode embedded in the gate trench and opposed to the epitaxial layer with the gate insulating film therebetween, a first conductive-type source layer formed in a manner exposed on a first surface of the epitaxial layer to define a portion of the side surface of the gate trench, a second conductive-type channel layer formed in a manner contacting the side of the source layer nearer to a second surface of the epitaxial layer to define a portion of the side surface of the gate trench, and a first conductive-type drift layer formed in a manner contacting the side of the channel layer nearer to the second surface of the epitaxial layer to define the bottom surface of the gate trench, in which the on-resistance $R_{on}$ represented by a variable "y" and the withstand voltage $V_b$ represented by a variable "x" functionally satisfy the following relational expression (4) (Aspect 7).

$$y \leq 2\times10^{-7}x^2 - 0.0002x + 0.9551 \quad (4)$$

In accordance with the semiconductor device according to the present invention, the on-resistance $R_{on}$ represented by a variable "y" and the withstand voltage $V_b$ represented by a variable "x" functionally satisfy the above relational expression (4), whereby it is possible to achieve both reduction in the on-resistance $R_{on}$ and increase in the withstand voltage $V_b$, which have conventionally been in a trade-off relationship.

This makes it possible, in production of products having the same resistance (on-resistance $R_{on}$) as conventional ones, to ensure a sufficient withstand voltage $V_b$ while reducing the active area of the substrate and/or the epitaxial layer to thereby reduce the size of the device and therefore the size of a semiconductor module including the semiconductor device according to the present invention. As a result, the number of chips which can be obtained from one substrate can be increased, resulting in an improvement in the manufacturing yield and therefore a reduction in the manufacturing cost can be achieved.

On the other hand, in production of semiconductor devices having the same active area as conventional ones, the on-resistance $R_{on}$ can be reduced relative to conventional ones, resulting in an improvement in the current capacity.

The semiconductor device according to the present invention preferably further includes, for example, a second conductive-type pillar layer formed in the drift layer in a manner continuing to the channel layer and extending from the channel layer toward the second surface of the epitaxial layer, in which in the epitaxial layer, a channel with a mobility of 11 cm$^2$/Vs or higher may be formed in the channel layer, and the substrate may have a thickness of 250 µm or less (Aspect 8).

In accordance with the arrangement above, since the second conductive-type pillar layer and the first conductive-type drift layer define a super junction structure in the epitaxial layer, the channel having a mobility of 11 cm$^2$/Vs or higher and the substrate having a thickness of 250 µm or less can satisfy the above relational expression (4).

That is, the channel is only required to have a mobility of 11 cm$^2$/Vs or higher, if increased, and the substrate is only required to have a thickness of 250 µm or less, if thinned, which allows the epitaxial layer to have a relatively large thickness and/or a low impurity concentration, while allowing the substrate to have a practical sufficient strength.

In the semiconductor device according to the present invention, the on-resistance $R_{on}$ and the withstand voltage $V_b$ preferably satisfy the following relational expression (5) (Aspect 9).

$$y \leq 2\times10^{-7}x^2 - 0.0002x + 0.7001 \quad (5)$$

In this arrangement, if the device further includes, for example, a second conductive-type pillar layer formed in the drift layer in a manner continuing to the channel layer and extending from the channel layer toward the second surface of the epitaxial layer, it is preferable that in the epitaxial layer, a channel with a mobility of 11 cm$^2$/Vs or higher is formed in the channel layer and the substrate has a thickness of 100 µm or less (Aspect 10).

In accordance with the arrangement above, since the second conductive-type pillar layer and the first conductive-type drift layer define a super junction structure in the epitaxial layer, the channel having a mobility of 11 cm$^2$/Vs or higher and the substrate having a thickness of 100 µm or less can satisfy the above relational expression (5).

In the semiconductor device according to the present invention, the on-resistance $R_{on}$ and the withstand voltage $V_b$ more preferably satisfy the following relational expression (6) (Aspect 11).

$$y \leq 2\times10^{-7}x^2 - 0.0002x + 0.6984 \quad (6)$$

In this arrangement, if the device further includes, for example, a second conductive-type pillar layer formed in the drift layer in a manner continuing to the channel layer and extending from the channel layer toward the second surface of the epitaxial layer, it is preferable that in the epitaxial layer, a channel with a mobility of 50 cm$^2$/Vs or higher is formed in the channel layer and the substrate has a thickness of 250 µm or less (Aspect 12).

In accordance with the arrangement above, since the second conductive-type pillar layer and the first conductive-type drift layer define a super junction structure in the epitaxial layer, the channel having a mobility of 50 cm$^2$/Vs or higher and the substrate having a thickness of 250 µm or less can satisfy the above relational expression 6).

In the semiconductor device according to the present invention, the on-resistance $R_{on}$ and the withstand voltage $V_b$ particularly preferably satisfy the following relational expression (7) (Aspect 13).

$$y \leq 2\times10^{-7}x^2 - 0.0002x + 0.4434 \quad (7)$$

In this arrangement, if the device further includes a second conductive-type pillar layer formed in the drift layer in a manner continuing to the channel layer and extending from the channel layer toward the second surface of the epitaxial layer, it is preferable that in the epitaxial layer, a channel with a mobility of 50 cm$^2$/Vs or higher is formed in the channel layer and the substrate has a thickness of 100 µm or less (Aspect 14).

In accordance with the arrangement above, since the second conductive-type pillar layer and the first conductive-type drift layer define a super junction structure in the epitaxial layer, the channel having a mobility of 50 cm$^2$/Vs or higher and the substrate having a thickness of 100 µm or less can satisfy the above relational expression (7)

The semiconductor device according to the present invention preferably further includes a second conductive-type breakdown voltage holding layer formed on the bottom surface of the gate trench in the epitaxial layer (Aspect 15).

In accordance with the arrangement above, a depletion layer due to junction (pn junction) between the breakdown voltage holding layer and the drift layer can be generated in the vicinity of the gate trench. The presence of the depletion layer can then keep the equipotential plane of a high potential based on the gate electrode away from the gate insulating film. As a result, the gate insulating film can be applied with a weakened electric field and thereby prevented from undergoing a breakdown, whereby it is possible to further increase the withstand voltage.

In the semiconductor device according to the present invention, it is preferable that the gate insulating film includes a bottom portion in contact with the bottom surface of the gate trench and a side portion in contact with the side surface of the gate trench, and the bottom portion of the gate insulating film is thicker than the side portion of the gate insulating film (Aspect 16).

By thickening the portion in contact with the bottom surface of the gate trench, at which an intense electric field is likely to be applied when the semiconductor device is in an off state, it is possible to prevent electric field concentration on the bottom portion of the gate insulating film.

In the semiconductor device according to the present invention, it is preferable that the substrate has an off-angle of 0 to 4 degrees (Aspect 17).

In accordance with the arrangement above, the interface state between the gate insulating film and the side surface of the gate trench can be lowered, whereby the channel formed in the channel layer can have a high mobility. This leads to a reduction in the channel resistance and therefore the on-resistance $R_{on}$ can be reduced. The substrate having an off-angle of 0 to 2 degrees can lead to a further reduction in the channel resistance and therefore the on-resistance $R_{on}$ can further be reduced.

BRIEF DESCRIPTION OF THE DRAWINGS

FIG. 1(a) is an overall view and FIG. 1(b) is an enlarged interior view.

MODES FOR CARRYING OUT THE INVENTION

Preferred embodiments of the present invention will hereinafter be described in detail with reference to the accompanying drawings.

Figure 2:
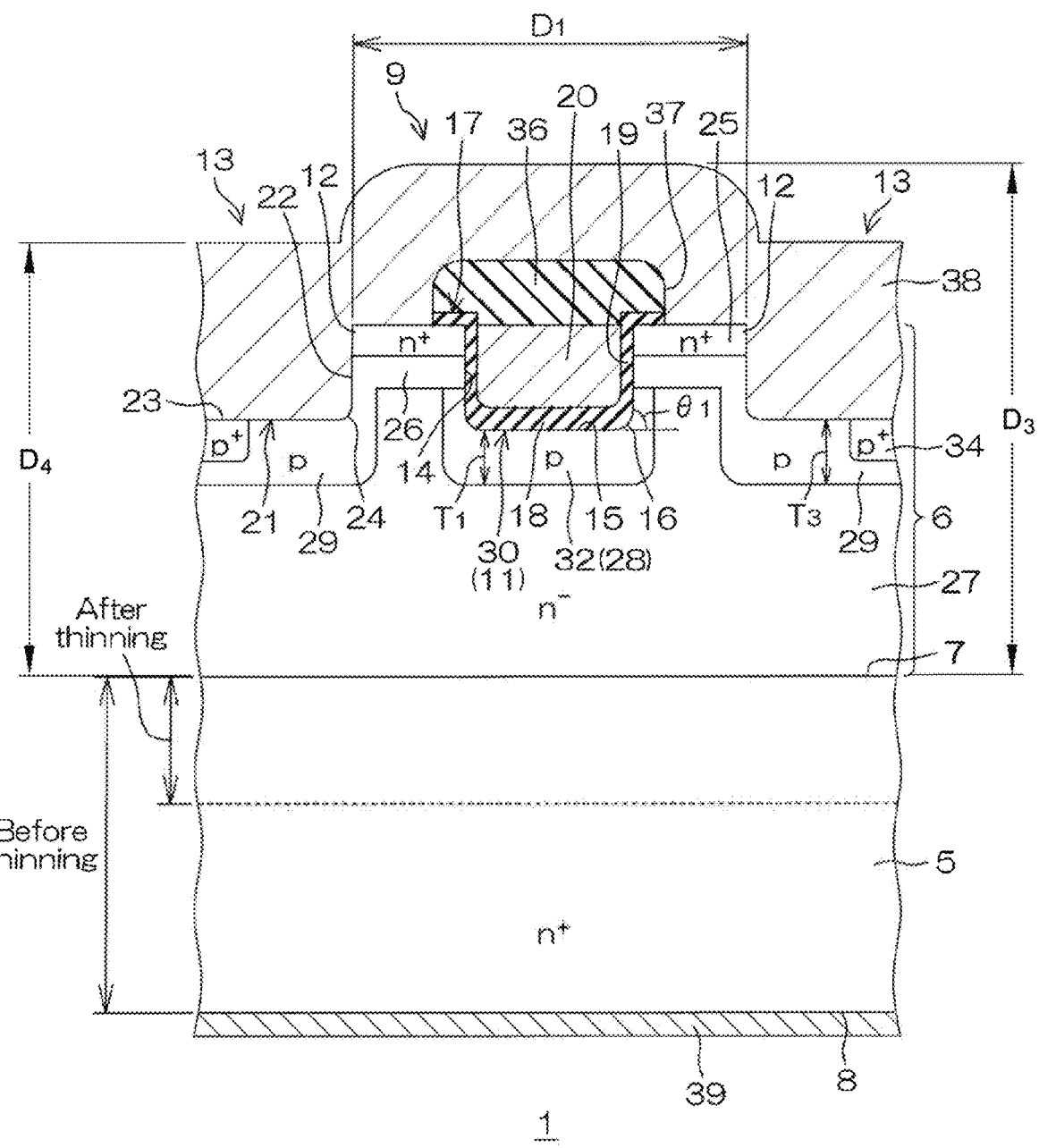
FIG. 2 is a cross-sectional view of the semiconductor device shown in FIGS. 1(a) and 1(b), showing a cross-section taken along the line II-II in FIG. 1(b).
Figure 3:
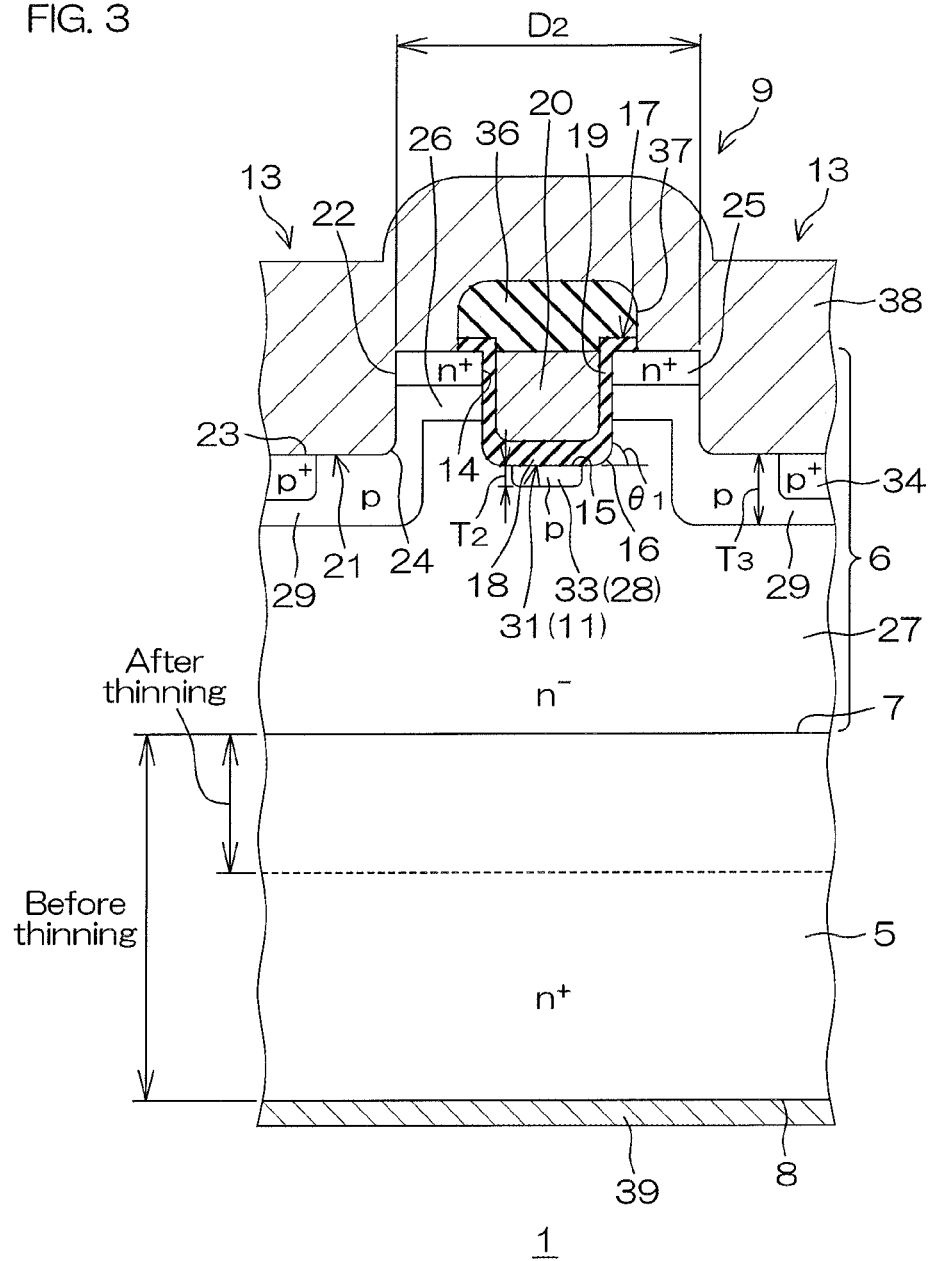
FIG. 3 is a cross-sectional view of the semiconductor device shown in FIGS. 1(a) and 1(b), showing a cross-section taken along the line III-III in FIG. 1(b).

FIGS. 1(a) and 1(b) are schematic plan views of a semiconductor device according to a first preferred embodiment of the present invention, where FIG. 1(a) is an overall view and FIG. 1(b) is an enlarged interior view. FIG. 2 is a cross-sectional view of the semiconductor device shown in FIGS. 1(a) and 1(b), showing a cross-section taken along the line II-II in FIG. 1(b). FIG. 3 is a cross-sectional view of the semiconductor device shown in FIGS. 1(a) and 1(b), showing a cross-section taken along the line III-III in FIG. 1(b).

The semiconductor device 1 includes an SiC-based trench-gate type MISFET (Metal Insulator Semiconductor Field Effect Transistor). As shown in FIG. 1(a), the semiconductor device 1 has, for example, a square chip-shaped contour in a plan view. The chip-shaped semiconductor device 1 is sized to have a vertical and horizontal length of about several millimeters in the illustration of FIG. 1(a).

A source pad 2 is formed on a surface of the semiconductor device 1. The source pad 2 has an approximately square shape in a plan view with the four corners being curved outward and is formed to cover approximately the whole of the surface of the semiconductor device 1. A removing region 3 is formed near the center of one side of the source pad 2. The source pad 2 is not formed in the removing region 3.

A gate pad 4 is disposed in the removing region 3. The gate pad 4 and the source pad 2 are spaced apart and insulated from each other.

Next will be described the internal structure of the semiconductor device 1.

The semiconductor device 1 includes an SiC substrate 5 and an SiC epitaxial layer 6 formed on the substrate 5. The conductive type of both the substrate 5 and the epitaxial layer 6 is "n," serving as a first conductive type. Specifically, the substrate 5 is $n^+$-type (with a concentration of, for example, $1 \times 10^{18}$ to $1 \times 10^{21}$ cm$^{-3}$), and the epitaxial layer 6 is $n^-$-type with a concentration (of, for example, $1 \times 10^{15}$ to $1 \times 10^{15}$ cm$^{-3}$) lower than that of the substrate 5.

The thickness of the substrate 5, which is, for example, 30 to 400 μm, may be changed appropriately within this range according to the channel mobility of the semiconductor device 1. As an example, the substrate 5 preferably has a thickness of 100 μm or less (but 50 μm or more) if the channel mobility is 11 cm$^2$/Vs or higher. Alternatively, the substrate 5 may have a thickness of 250 μm or less (but 200 μm or more) if the channel mobility is 50 cm$^2$/Vs or higher.

The substrate 5 with such a thickness can employ an SiC wafer of the thickness, if available, without change as indicated by "Before thinning" in FIG. 2. On the other hand, if it is necessary for the substrate 5 to be thinner than the SiC wafer, a technique such as grinding, dry-etching, or sandblasting can be used, for example, to grind and thin the substrate 5 from a second surface 8 (opposite to a first surface 7 on which the epitaxial layer 6 is formed) as indicated by "After thinning" in FIG. 2.

A substrate has conventionally been made thicker than an epitaxial layer to be grown thereon to prevent the wafer from being damaged. In this regard, the inventor of this application has found that in SiC semiconductor devices having a trench-gate structure, since the resistance of the substrate accounts for about 15 to 25% of the on-resistance $R_{on}$, thinning the substrate 5 without losing the strength of the semiconductor device 1 can reduce the on-resistance $R_{on}$ effectively while ensuring the strength of the semiconductor device 1.

The epitaxial layer 6 has a thickness of, for example, 3 to 100 μm in this preferred embodiment.

In addition, the substrate 5 has an off-angle of, for example, 4 degrees. Specifically, the first surface 7 (principal surface) of the substrate 5 is inclined at an off-angle of 4 degrees with respect to the (0001) plane in the [11-20] axial direction. The off-angle may not be limited thereto, but may be selected from the range of 0 to 4 degrees.

As shown in FIG. 1(a), the semiconductor device 1 is formed with an active region 9 and a peripheral region 10 surrounding the active region 9. The active region 9 is disposed in, for example, the central portion of the semiconductor device 1 in a plan view.

In the active region 9, the epitaxial layer 6 is formed with a gate trench 11. In this preferred embodiment, the gate trench 11 is formed in a grid shape as shown in FIG. 1(b). However, the shape of the gate trench 11 may not be limited to a grid, but may be a stripe, a honeycomb, or the like.

In this preferred embodiment, since the grid-shaped gate trench 11 is thus formed, a number of rectangular parallelepiped (square in a plan view) unit cells 13 having four corners 12 are formed, respectively, in the window portions each surrounded by the gate trench 11 in the epitaxial layer 6. In each of the unit cells 13, the depth direction of the gate trench 11 corresponds to the gate length direction, while the circumferential direction of the unit cell 13, which is perpendicular to the gate length direction, corresponds to the gate width direction.

Further, the gate trench 11 is formed in a U-shaped cross-section so that the corner 16 of the side surface 14 and the bottom surface 15 is curved. In this case, the side surface 14 of the gate trench 11 is inclined at an angle of, for example, 0 to 4 degrees with respect to a plane perpendicular to the first surface 7 of the substrate 5, which has an off-angle of 0 to 4 degrees. If a channel portion in the side surface 14 of the gate trench 11 substantially has an off-angle of 0 degrees, the interface state between a gate insulating film 17 (to be described hereinafter) and the side surface 14 of the gate trench 11 can be lowered, whereby a channel formed in a channel layer 26 (to be described hereinafter) can have a high mobility. This can lead to a reduction in the channel resistance and therefore the on-resistance $R_{on}$ can be reduced.

The gate trench 11 is formed by, for example, dry-etching the epitaxial layer 6 to define the contour of the gate trench 11 and then wet-etching the inner surface. This can improve the flatness of the side surface 14 of the gate trench 11. As a result, the number of collisions between electrons in a current flow along the side surface 14 of the gate trench 11 can be reduced and thereby the channel mobility can be increased.

A gate insulating film 17 composed of an insulating material such as $SiO_2$ is formed to cover the whole of the inner surface (including the side surface 14, the bottom surface 15, and the corner 16) of the gate trench 11.

The gate insulating film 17 includes a bottom portion 18 in contact with the bottom surface 15 of the gate trench 11 and a side portion 19 in contact with the side surface 14 of the gate trench 11, in which the bottom portion 18 is thicker than the side portion 19. For example, the side portion 19 has a thickness of 400 to 800 Å, while the bottom portion 18 has a thickness of 1000 to 3000 Å. By thickening the bottom portion 18 in contact with the bottom surface 15 of the gate trench 11, to which an intense electric field is likely to be applied when the semiconductor device 1 is in an off state, it is possible to prevent electric field concentration on the bottom portion 18 of the gate insulating film 17.

In order to thus provide a difference in thickness between the bottom portion 18 and the side portion 19 of the gate insulating film 17, after the formation of the gate trench 11, for example, a CVD method or the like is first used to deposit an insulating material to fill the inside of the gate trench 11 and thereby form an insulating layer. An etch-back method or the like is then used to set back the surface (etch-back surface) of the insulating layer toward the second surface of the epitaxial layer 6. The portion of the insulating layer in contact with the side surface 14 of the gate trench 11 is thus removed, while the portion of the insulating layer left on the bottom surface 15 remains as the bottom portion 18. Thereafter, a thermal oxidation method or the like can be used to form the side portion 19 on the side surface 14 of the exposed gate trench 11. Through the process, the gate insulating film 17 provided with a difference in thickness between the bottom portion 18 and the side portion 19 can be formed.

Also, a gate electrode 20 composed of a conductive material such as polysilicon is embedded in the gate trench 11. The gate electrode 20 is opposed to the epitaxial layer 6 with the gate insulating film 17 therebetween.

A source trench 21 is formed in the central portion of each unit cell 13. In this preferred embodiment, the source trench 21 has a quadrilateral shape in a plan view and the same depth as that of the gate trench 11. Like the gate trench 11, the source trench 21 is also formed in a U-shaped cross-section so that the corner 24 of the side surface 22 and the bottom surface 23 is curved.

In each unit cell 13, a source layer 25, a channel layer 26, and a drift layer 27 are formed from the first surface to the second surface of the epitaxial layer 6, the layers 25 to 27 being in contact with each other. The conductive type of the source layer 25 and the drift layer 27 is "n," serving as a first conductive type, while the conductive type of the channel layer 26 is serving as a second conductive type. Specifically, the source layer 25 is n⁻-type (with a concentration of, for example, $1\times10^{18}$ to $1\times10^{21}$ cm$^{-3}$), the channel layer 26 is p-type (with a concentration of, for example, $1.0\times10^{16}$ to $1.0\times10^{19}$ cm$^{-3}$), and the drift layer 27 is n⁻-type with a concentration (of, for example, $1\times10^{15}$ to $1\times10^{17}$ cm$^{-3}$) lower than that of the source layer 25.

The source layer 25 defines a portion of the side surface 14 of the gate trench 11 and a portion of the side surface 22 of the source trench 21. The channel layer 26 also defines a portion of the side surface 14 of the gate trench 11 and a portion of the side surface 22 of the source trench 21. The drift layer 27 defines the corner 16 and the bottom surface 15 of the gate trench 11 and the corner 24 and the bottom surface 23 of the source trench 21.

The layers 25 to 27 may be formed by ion implantations and activation treatments after the growth of the epitaxial layer 6 on the substrate 5 or by epitaxially growing the drift layer 27, the channel layer 26, and the source layer 25 in this order directly on the first surface 7 of the substrate 5. The latter of the techniques, which is based on epitaxial growth, is preferable because the interface state between the gate insulating film 17 and the side surface 14 of the gate trench 11 can be lowered.

The epitaxial layer 6 is also formed with a gate breakdown voltage holding layer 28 and a source breakdown voltage holding layer 29 as breakdown voltage holding layers. The conductive type of both the layers 28 and 29 is "p," serving as a second conductive type. Specifically, the gate breakdown voltage holding layer 28 and the source breakdown voltage holding layer 29 are p-type (with a concentration of, for example, $1.0 \times 10^{16}$ to $1.0 \times 10^{19}$ cm$^{-3}$).

The gate breakdown voltage holding layer 28 is formed along the grid-shaped gate trench 11 and integrally includes a first portion 32 formed in an intersectional portion 30 of the gate trench 11 and a second portion 33 formed in a linear portion 31 of the gate trench 11.

The first portion 32 of the gate breakdown voltage holding layer 28 is formed from the bottom surface 15 of the gate trench 11 in the intersectional portion 30 through the corner 16 of the gate trench 11 to the channel layer 26 immediately above the corner 16. That is, the first portion 32 is formed in a square shape slightly larger than the intersectional portion 30 of the gate trench 11 with the corners thereof entering the corresponding corners 12 of the four respective unit cells 13 that face the intersectional portion 30. In the direction from the bottom surface 15 of the gate trench 11 toward the substrate 5, the first portion 32 has a thickness $T_1$ of, for example, about 0.8 μm.

The second portion 33 of the gate breakdown voltage holding layer 28 is formed in a linear shape with a constant width connecting adjacent first portions 32 only on the bottom surface 15 so as not to overlap the corner 16 of the gate trench 11. The second portion 33 also has a width (of, for example, 1.8 μm) smaller than the width of the linear portion 31 of the gate trench 11 (the distance (of, for example, 1 μm) between the side surfaces 14 of gate trenches 11 facing each other). In the direction from the bottom surface 15 of the gate trench 11 toward the substrate 5, the second portion 33 has a thickness $T_2$ of, for example, about 0.7 μm, which is smaller than the thickness $T_1$ of the first portion 32 (i.e., $T_1 > T_2$).

The source breakdown voltage holding layer 29 is formed from the bottom surface 23 of the source trench 21 through the corner 24 of the source trench 21 to the channel layer 26 immediately above the corner 24. In the direction from the bottom surface 23 of the source trench 21 toward the substrate 5, the source breakdown voltage holding layer 29 has a thickness $T_3$ (of, for example, about 0.8 μm), which is the same as the thickness $T_1$ of the first portion 32 of the gate breakdown voltage holding layer 28.

On the bottom surface 23 of the source trench 21, a channel contact layer 34 is formed in a surficial portion of the source breakdown voltage holding layer 29. The conductive type of the channel contact layer 34 is "p," serving as a second conductive type. Specifically, the channel contact layer 34 is p$^+$-type (with an impurity concentration of, for example, $1.0 \times 10^{18}$ to $2.0 \times 10^{21}$ cm$^{-3}$).

In the peripheral region 10, multiple (four in this preferred embodiment) p-type guard rings 35 are formed in a surficial portion of the epitaxial layer 6 in a manner surrounding the unit cells 13 (active region 9), which is arranged in a matrix, and spaced apart from the active region 9. The guard rings 35 may be formed during the ion implantation process for the formation of the p-type channel layer 26.

An interlayer insulating film 36 composed of an insulating material such as $SiO_2$ is laminated on the epitaxial layer 6 to cover the gate electrode 20.

A contact hole 37 with a diameter larger than that of the source trench 21 is formed in the interlayer insulating film 36 and the gate insulating film 17. In each unit cell 13, this causes the entire source trench 21 and the peripheral edge portion of the source trench 21 in the epitaxial layer 6 to be exposed to the inside of the contact hole 37, whereby a step is formed according to the difference in height between the first surface of the epitaxial layer 6 and the bottom surface 23 of the source trench 21.

A source electrode 38 is formed on the interlayer insulating film 36. The source electrode 38 integrally enters the source trenches 21 of all the unit cells 13 through the contact holes 37 so that a conductive portion is embedded in the source trench 21 and, in each unit cell 13, is in contact with the channel contact layer 34, the source breakdown voltage holding layer 29, the channel layer 26, and the source layer 25 in this order from the bottom of the source trench 21. That is, the source electrode 38 is an interconnection common to all the unit cells 13.

Figure 1:
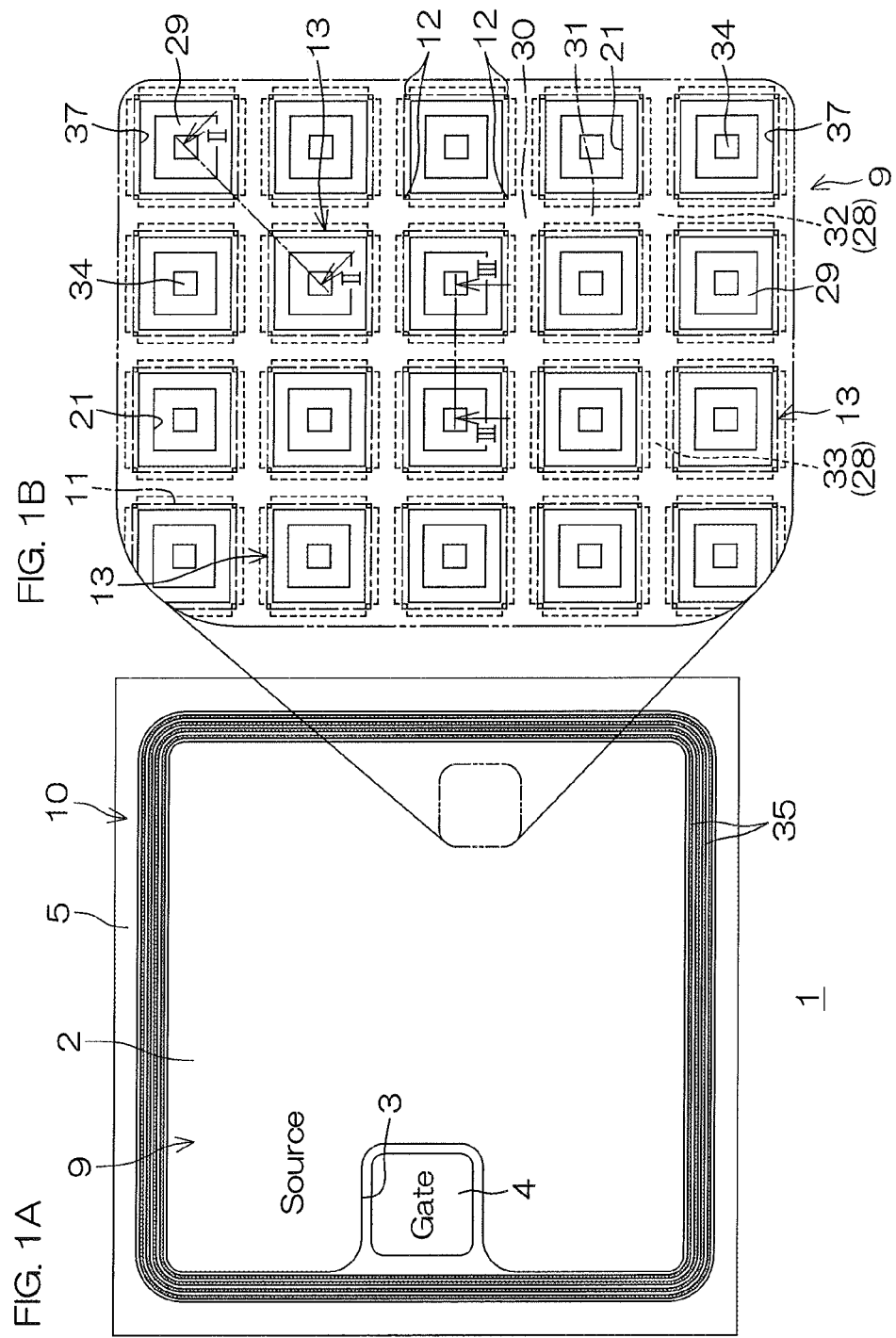
FIGS. 1(a) and 1(b) are schematic plan views of a semiconductor device according to a first preferred embodiment of the present invention, where

An interlayer insulating film (not shown) is then formed on the source electrode 38 and, via the interlayer insulating film (not shown), the source electrode 38 is electrically connected to the source pad 2 (see FIG. 1 (a)). On the other hand, the gate pad 4 (see FIG. 1 (a)) is electrically connected to the gate electrode 20 via a gate interconnection (not shown) arranged on the interlayer insulating film (not shown). As seen in FIG. 2, a distance D3 from the surface of the substrate 7 to the surface of the source electrode over the gate electrode 20, which is a conductive member embedded in the gate trench, is greater than a distance D4 from the surface of the surface of the substrate 7 to the surface of the source electrode over the conductive portion embedded in the source trench 21. The same is true for the further embodiments discussed below.

The source electrode 38 also has a structure in which a Ti/TiN layer and an Al layer, for example, are laminated in this order from the side in contact with the epitaxial layer 6.

On the second surface 8 of the substrate 5, a drain electrode 39 is formed to cover the whole of the surface. The drain electrode 39 is common to all the unit cells 13. The drain electrode 39 may employ a laminated structure (Ti/Ni/Au/Ag) in which Ti, Ni, Au, and Ag, for example, are laminated in this order from the substrate 5.

The drain electrode 39 is formed, for example, by first depositing Ni at a thickness of about 600 Å on the second surface 8 of the substrate 5. Next, a laser annealing treatment is applied to the substrate 5 to silicide Ni and thereby forms a contact layer on the substrate 5. Unlike the common annealing treatment, the laser annealing treatment can prevent the source electrode 38 from being placed under a high-temperature environment to be melted. After the formation of the contact layer, Ti, Ni, Au, and Ag can then be laminated in this order to form an electrode having a total thickness of 1 μm.

Next will be described a prototype produced to investigate the relationship between the on-resistance $R_{on}$ and the withstand voltage $V_b$ of the semiconductor device 1 shown in FIGS. 2 and 3.

Specifically, a semiconductor device 1 including a substrate 5 with a thickness of 100 μm was produced. The impurity concentration of an epitaxial layer 6 was changed such that the withstand voltage $V_b$ of the semiconductor device 1 was 600V and 1200V, and the on-resistance $R_{on}$ was measured for each of the cases. As a result, the on-resistance $R_{on}$ was 0.79 mΩ·cm$^2$ when the withstand voltage $V_b$=600V, while the on-resistance $R_{on}$ was 1.41 mΩ·cm$^2$ when the withstand voltage $V_b$=1200V. In addition, the withstand voltage $V_b$ was measured at a drain saturation current ($I_{DSS}$) of 100 μA and the on-resistance $R_{on}$ was measured at a current density $J_D$ of 100 A/cm$^2$.

In addition, described will be a simulation performed to investigate the relationship between the on-resistance $R_{on}$ and the withstand voltage $V_b$ of the semiconductor device 1 shown in FIGS. 2 and 3.

Specifically, simulations were performed for four types of semiconductor devices with the channel mobility (Ch mobility) set, respectively, at 11, 30, 50, and 100 cm²/Vs under the conditions with the thickness of the substrate 5 set at 100 μm (Sub thinned) and 250 μm, that is, a total of eight simulation examples 1 to 8 were provided.

In the simulation examples 1 to 8, the impurity concentration of the epitaxial layer 6 was changed to provide predetermined withstand voltages $V_b$ (the epitaxial layer 6 had a higher impurity concentration as the measurement number decreases, while having a lower impurity concentration as the measurement number increases), and the on-resistance $R_{on}$ was simulated for each of the cases. The relationship between the withstand voltage $V_b$ and the on-resistance $R_{on}$ was then investigated by functionally satisfying the on-resistance $R_{on}$ represented by a variable "y" and the withstand voltage $V_b$ represented by a variable "x." In addition, the withstand voltage $V_b$ was measured at a drain saturation current ($I_{DSS}$) of 100 μA and the on-resistance $R_{on}$ was measured at a current density $J_D$ of 100 A/cm².

The result is shown in Table 1 below and FIG. 4.

TABLE 1

| Simulation No. | Measurement No. | Ch mobility (cm²/Vs) | Substrate thickness (μm) | Withstand voltage Vb (V) | On-resistance $R_{on}$ (mΩ · cm²) |
| --- | --- | --- | --- | --- | --- |
| Example 1 | 1 | 11 | 100 | 680 | 0.81 |
| | 2 | | | 828 | 1.01 |
| | 3 | | | 1100 | 1.34 |
| | 4 | | | 1457 | 1.91 |
| | 5 | | | 1883 | 3.07 |
| | 6 | | | 3766 | 11.48 |
| Example 2 | 1 | 30 | 100 | 680 | 0.60 |
| | 2 | | | 828 | 0.80 |
| | 3 | | | 1100 | 1.14 |
| | 4 | | | 1457 | 1.70 |
| | 5 | | | 1883 | 2.86 |
| | 6 | | | 3766 | 11.27 |
| Example 3 | 1 | 50 | 100 | 680 | 0.55 |
| | 2 | | | 828 | 0.75 |
| | 3 | | | 1100 | 1.09 |
| | 4 | | | 1457 | 1.65 |
| | 5 | | | 1883 | 2.81 |
| | 6 | | | 3766 | 11.23 |
| Example 4 | 1 | 100 | 100 | 680 | 0.52 |
| | 2 | | | 828 | 0.72 |
| | 3 | | | 1100 | 1.05 |
| | 4 | | | 1457 | 1.61 |
| | 5 | | | 1883 | 2.77 |
| | 6 | | | 3766 | 11.19 |
| Example 5 | 1 | 11 | 250 | 680 | 1.07 |
| | 2 | | | 828 | 1.26 |
| | 3 | | | 1100 | 1.60 |
| | 4 | | | 1457 | 2.16 |
| | 5 | | | 1883 | 3.32 |
| | 6 | | | 3766 | 11.74 |
| Example 6 | 1 | 30 | 250 | 680 | 0.86 |
| | 2 | | | 828 | 1.05 |
| | 3 | | | 1100 | 1.39 |
| | 4 | | | 1457 | 1.95 |
| | 5 | | | 1883 | 3.11 |
| | 6 | | | 3766 | 11.53 |
| Example 7 | 1 | 50 | 250 | 680 | 0.81 |
| | 2 | | | 828 | 1.01 |
| | 3 | | | 1100 | 1.34 |
| | 4 | | | 1457 | 1.90 |
| | 5 | | | 1883 | 3.06 |
| | 6 | | | 3766 | 11.48 |
| Example 8 | 1 | 100 | 250 | 680 | 0.77 |
| | 2 | | | 828 | 0.97 |
| | 3 | | | 1100 | 1.31 |
| | 4 | | | 1457 | 1.87 |
| | 5 | | | 1883 | 3.03 |
| | 6 | | | 3766 | 11.44 |

Figure 4:
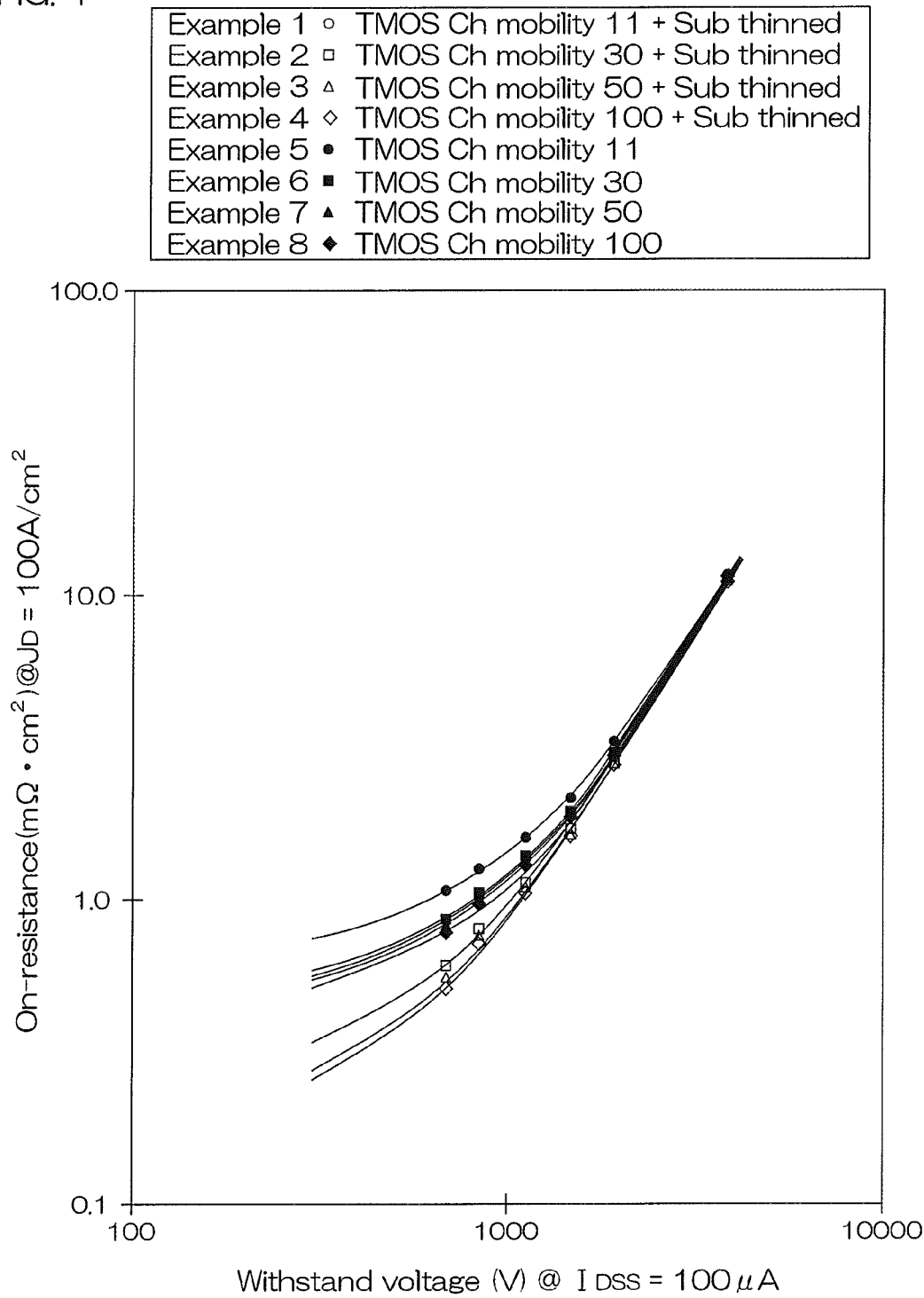
FIG. 4 is a graph (simulation data) showing the relationship between the on-resistance $R_{on}$ and the withstand voltage $V_b$ of the semiconductor device shown in FIGS. 2 and 3.

In FIG. 4, the plotted graphs represent Example 5, 6, 1=7, 8, 2, 3, and 4 in this order from the top.

Among Examples 1 to 8, the graph of Example 1 satisfies $y_1 = 9 \times 10^{-7} x_1^2 - 0.0004 x_1 + 0.7001$ ... (1'), the graph of Example 7 satisfies $y_2 = 9 \times 10^{-7} x_2^2 - 0.0004 x_2 + 0.6984$ ... (2'), and the graph of Example 3 satisfies $y_3 = 9 \times 10^{-7} x_3^2 - 0.0004 x_3 + 0.4434$ ... (3').

From the above result, it is found that the semiconductor device 1 according to the first preferred embodiment satisfies the following relational expression (1), which conventional semiconductor devices could not have satisfied.

$$y \leq 9 \times 10^{-7} x^2 - 0.0004 x + 0.7001 = y_1 \quad (1)$$

It is also found that if the relational expression (1) is satisfied, it is possible to achieve both reduction in the on-resistance $R_{on}$ and increase in the withstand voltage $V_b$, which have conventionally been in a trade-off relationship.

This makes it possible, in production of products having the same resistance (on-resistance $R_{on}$) as conventional ones, to ensure a sufficient withstand voltage $V_b$ while reducing the area of the active region 9 of the substrate 5 and/or the epitaxial layer 6 to thereby reduce the size of the device and therefore the size of a semiconductor module including the semiconductor device 1. As a result, the number of chips which can be obtained from one substrate 5 can be increased, resulting in an improvement in the manufacturing yield and therefore a reduction in the manufacturing cost can be reduced.

On the other hand, in production of semiconductor devices having the same active area as conventional ones, the on-resistance $R_{on}$ can be reduced relative to conventional ones, resulting in an improvement in the current capacity.

Further, if the thickness of the substrate 5 is 100 μm or less (Examples 1 to 4), the channel is only required to have a mobility of 11 cm²/Vs or higher, if increased to reduce the channel resistance, to thereby satisfy the above relational expression (1). This allows the epitaxial layer 6 to have a relatively large thickness and/or a low impurity concentration. It is therefore possible to achieve a higher withstand voltage $V_b$ even at the same on-resistance $R_{on}$.

On the other hand, even if the thickness of the substrate 5 is as large as 250 μm, the channel is only required to have a mobility of 50 cm²/Vs or higher (Examples 7 and 8) to thereby satisfy the above relational expression (1). In this case, the substrate 5 is only required to have a thickness of 250 μm or less, if thinned to reduce the resistance of the substrate 5, which allows the substrate to have a practical sufficient strength. As a result, the substrate 5 can be handled and diced efficiently in the process of manufacturing the semiconductor device 1.

In the semiconductor device 1, a drain voltage is then applied between the source electrode 38 and the drain electrode 39 (between source and drain) with the source electrode 38 being grounded. In this state, when a voltage equal to or higher than the gate threshold voltage is applied to the gate electrode 20, a channel is formed along the channel layer 26, which defines the side wall of each unit cell 13. This causes a current to flow from the drain electrode 39 to the source electrode 38, so that each unit cell 13 turns on.

On the other hand, if each unit cell 13 is in an off state (i.e., the gate voltage is 0V) and the voltage between source and drain remains to be applied, an electric field is applied to the gate insulating film 17, which is provided between the gate electrode 20 and the epitaxial layer 6.

The electric field is caused by a potential difference between the gate electrode 20 and the epitaxial layer 6. The equipotential plane distributed in the bottom surface 15 of the gate trench 11 is of a very high potential based on the gate electrode 20 (0V) and of small plane intervals, resulting in a very large electric field. For example, if the drain voltage is 900V, the equipotential plane distributed in the vicinity of the second surface 8 of the substrate 5 in contact with the drain electrode 39 is 900V and, with a voltage drop from the second surface 8 of the substrate 5 toward the first surface of the epitaxial layer 6, the equipotential plane distributed in the vicinity of the bottom surface 15 of the gate trench 11 is about several tens of voltages. This causes a very large electric field directed toward the gate electrode 20 to be generated in the bottom surface 15 of the gate trench 11. In particular, if the gate trench 11 is formed in a grid shape and the quadrangular prism-shaped unit cells 13 are arranged in the window portions of the grid-shaped gate trench 11 as in this preferred embodiment, the gate insulating film 17 is likely to undergo a breakdown in the vicinity of the corner 16 of the gate trench 11 formed at each corner 12 of the unit cell 13.

Specifically, the distance $D_1$ (see FIG. 2) between adjacent source trenches 21 on the diagonal line of the intersectional portion 30 of the gate trench 11 is greater than the distance $D_2$ (see FIG. 3) between adjacent source trenches 21 on either side of the linear portion 31 of the gate trench 11 (e.g. $D_1$ is 1.4 times greater than $D_2$ in this preferred embodiment). This causes the equipotential plane to enter a portion immediately below the corner 16 of the intersectional portion 30 of the gate trench 11, which has a relatively large space, resulting in a dense equipotential plane. As a result, the gate insulating film 17 is likely to undergo a breakdown, particularly, in the vicinity of the corner 16 of the gate trench 11.

Hence, in the semiconductor device 1 according to this preferred embodiment, the gate breakdown voltage holding layer 28 (first portion 32) is formed at the corner 16 of the intersectional portion 30 of the gate trench 11. This allows a depletion layer due to junction (pn junction) between the first portion 32 and the drift layer 27 to be generated in the vicinity of the intersectional portion 30 of the gate trench 11. Further, in the semiconductor device 1, the source breakdown voltage holding layer 29 is formed at the corner 24 of the source trench 21 formed in each unit cell 13. This allows a depletion layer due to junction (pn junction) between the source breakdown voltage holding layer 29 and the drift layer 27 to be expanded toward the corner 16 of the intersectional portion 30 of the gate trench 11 surrounding the source trench 21.

The presence of the depletion layers can prevent the equipotential plane from entering between the corner 16 of the intersectional portion 30 of the gate trench 11 and the corner 24 of the source trench 21, that is, can keep the equipotential plane away from the gate insulating film 17. As a result, the equipotential plane can be prevented from becoming dense in the vicinity of the corner 16 of the intersectional portion 30 of the gate trench 11. Accordingly, the gate insulating film 17 can be applied with a weakened electric field and thereby prevented from undergoing a breakdown.

Also, in the semiconductor device 1, while the first portion 32 is formed through the corner 16 to the channel layer 26 immediately above the corner 16, no channel is formed at each corner 12 of the unit cell 13 or, if formed, only a small current flows through the channel. For this reason, thus forming the gate breakdown voltage holding layer 28 (first portion 32) to the portion of the channel layer 26 immediately above the corner 16 allows for a further improvement in the effect of preventing the gate insulating film 17 from undergoing a breakdown with a limited impact on the performance of the device.

On the other hand, the gate breakdown voltage holding layer 28 (second portion 33) having a width smaller than that of the linear portion 31 of the gate trench 11 is formed on the linear portion 31. This allows a depletion layer due to junction (pn junction) between the second portion 33 and the drift layer 27 to be generated along the linear portion 31 of the gate trench 11. It is therefore possible to relax, with the depletion layer, the electric field generated immediately below the linear portion 31 of the gate trench 11. As a result, the electric field generated in the gate insulating film 17 can be relaxed evenly throughout.

In addition, the gate breakdown voltage holding layer 28 (second portion 33) is not formed on the side surface 14 of the linear portion 31 of the gate trench 11 (i.e., the portion of the unit cell 13 where a channel is formed). This allows for accurate control of the channel properties.

Figure 5:
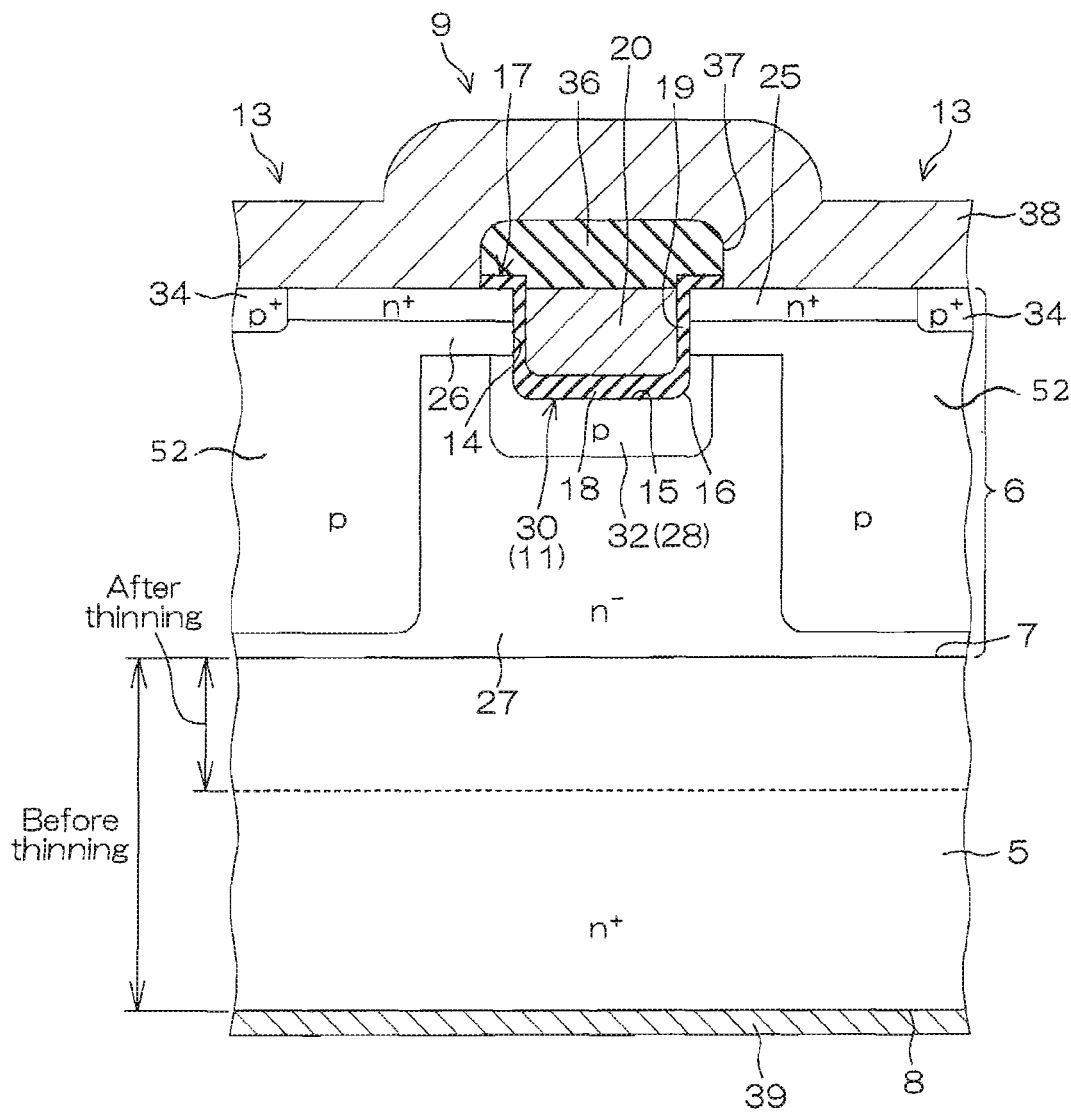
FIG. 5 is a schematic cross-sectional view of a semiconductor device according to a second preferred embodiment of the present invention, showing a cross-section taken along the same line as in FIG. 2.
Figure 6:
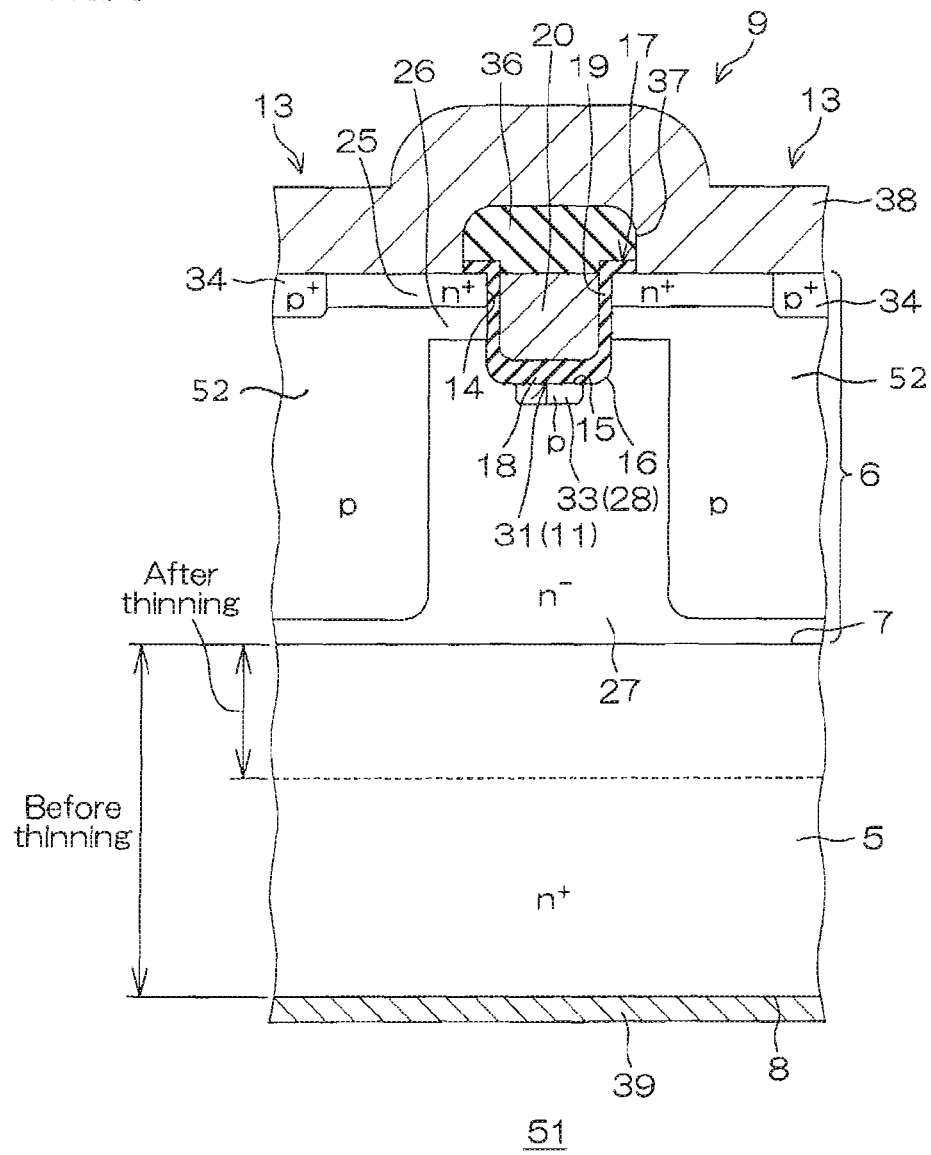
FIG. 6 is a schematic cross-sectional view of the semiconductor device according to the second preferred embodiment of the present invention, showing a cross-section taken along the same line as in FIG. 3.

FIG. 5 is a schematic cross-sectional view of a semiconductor device according to a second preferred embodiment of the present invention, showing a cross-section taken along the same line as in FIG. 2. FIG. 6 is a schematic cross-sectional view of the semiconductor device according to the second preferred embodiment of the present invention, showing a cross-section taken along the same line as in FIG. 3. In FIGS. 5 and 6, portions corresponding to those shown in FIGS. 2 and 3 are designated by the same reference signs to omit the description thereof.

In the semiconductor device 51 according to the second preferred embodiment, the source trench 21 is not formed. The channel contact layer 34, which has been formed on the bottom surface 23 of the source trench 21, is formed in the first surface of the epitaxial layer 6 in this preferred embodiment.

Further, in the semiconductor device 51, a p-type pillar layer 52 is formed in the drift layer 27.

The p-type pillar layer 52 is formed in an inner region of the channel layer 26 of each unit cell 13. More specifically, in this preferred embodiment, the p-type pillar layer 52 is formed in a shape similar to, for example, the channel layer 26 (in a quadrilateral shape in a plan view in the layout of FIG. 1(b)) in approximately the central region of the channel layer 26. The p-type pillar layer 52 is formed in a manner continuing to the channel layer 26 and extends toward the substrate 5 to a depth greater than that of the channel layer 26 in the drift layer 27. That is, the p-type pillar layer 52 is formed in an approximately pillar shape (in an approximately quadrangular prism shape in the layout of FIG. 1(b)).

This causes the epitaxial layer 6 to be formed with a super junction (SJ) structure in which the p-type pillar layer 52 arranged at an appropriate pitch and the n-type drift layer sandwiched between adjacent p-type pillar layers 52 are arranged alternately along the first surface of the epitaxial layer 6.

Next will be described a simulation performed to investigate the relationship between the on-resistance $R_{on}$ and the withstand voltage $V_b$ of the semiconductor device 51 shown in FIGS. 5 and 6.

Specifically, simulations were performed for four types of semiconductor devices with the channel mobility (Ch mobility) set, respectively, at 11, 30, 50, and 100 cm²/Vs under the conditions with the thickness of the substrate 5 set at 100 μm (Sub thinned) and 250 μm, that is, a total of eight simulation examples 9 to 16 were provided.

In the simulation examples 9 to 16, the impurity concentration of the epitaxial layer 6 was changed to provide predetermined withstand voltages $V_b$ (the epitaxial layer 6 had a higher impurity concentration as the measurement number decreases, while having a lower impurity concentration as the measurement number increases), and the on-resistance $R_{on}$ was simulated for each of the cases. The relationship between the withstand voltage $V_b$ and the on-resistance $R_{on}$ was then investigated by functionally satisfying the on-resistance $R_{on}$ represented by a variable "y" and the withstand voltage $V_b$ represented by a variable "x." In addition, the withstand voltage $V_b$ was measured at a drain saturation current ($I_{DSS}$) of 100 μA and the on-resistance $R_{on}$ was measured at a current density $J_D$ of 100 A/cm².

The result is shown in Table 2 below and FIG. 7.

TABLE 2

| Simulation No. | Measurement No. | Ch mobility (cm²/Vs) | Substrate thickness (μm) | Withstand voltage Vb (V) | On-resistance $R_{on}$ (mΩ · cm²) |
|---|---|---|---|---|---|
| Example 9 | 1 | 11 | 100 | 1361 | 0.81 |
| | 2 | | | 1657 | 1.01 |
| | 3 | | | 2199 | 1.34 |
| | 4 | | | 2915 | 1.91 |
| | 5 | | | 3767 | 3.07 |
| | 6 | | | 7533 | 11.48 |
| Example 10 | 1 | 30 | 100 | 1361 | 0.60 |
| | 2 | | | 1657 | 0.80 |
| | 3 | | | 2199 | 1.14 |
| | 4 | | | 2915 | 1.70 |
| | 5 | | | 3767 | 2.86 |
| | 6 | | | 7533 | 11.27 |
| Example 11 | 1 | 50 | 100 | 1361 | 0.55 |
| | 2 | | | 1657 | 0.75 |
| | 3 | | | 2199 | 1.09 |
| | 4 | | | 2915 | 1.65 |
| | 5 | | | 3767 | 2.81 |
| | 6 | | | 7533 | 11.23 |
| Example 12 | 1 | 100 | 100 | 1361 | 0.52 |
| | 2 | | | 1657 | 0.72 |
| | 3 | | | 2199 | 1.05 |
| | 4 | | | 2915 | 1.61 |
| | 5 | | | 3767 | 2.77 |
| | 6 | | | 7533 | 11.19 |
| Example 13 | 1 | 11 | 250 | 1361 | 1.07 |
| | 2 | | | 1657 | 1.26 |
| | 3 | | | 2199 | 1.60 |
| | 4 | | | 2915 | 2.16 |
| | 5 | | | 3767 | 3.32 |
| | 6 | | | 7533 | 11.74 |
| Example 14 | 1 | 30 | 250 | 1361 | 0.86 |
| | 2 | | | 1657 | 1.05 |
| | 3 | | | 2199 | 1.39 |
| | 4 | | | 2915 | 1.95 |
| | 5 | | | 3767 | 3.11 |
| | 6 | | | 7533 | 11.53 |
| Example 15 | 1 | 50 | 250 | 1361 | 0.81 |
| | 2 | | | 1657 | 1.01 |
| | 3 | | | 2199 | 1.34 |
| | 4 | | | 2915 | 1.90 |
| | 5 | | | 3767 | 3.06 |
| | 6 | | | 7533 | 11.48 |
| Example 16 | 1 | 100 | 250 | 1361 | 0.77 |
| | 2 | | | 1657 | 0.97 |
| | 3 | | | 2199 | 1.31 |
| | 4 | | | 2915 | 1.87 |
| | 5 | | | 3767 | 3.03 |
| | 6 | | | 7533 | 11.44 |

Figure 7:
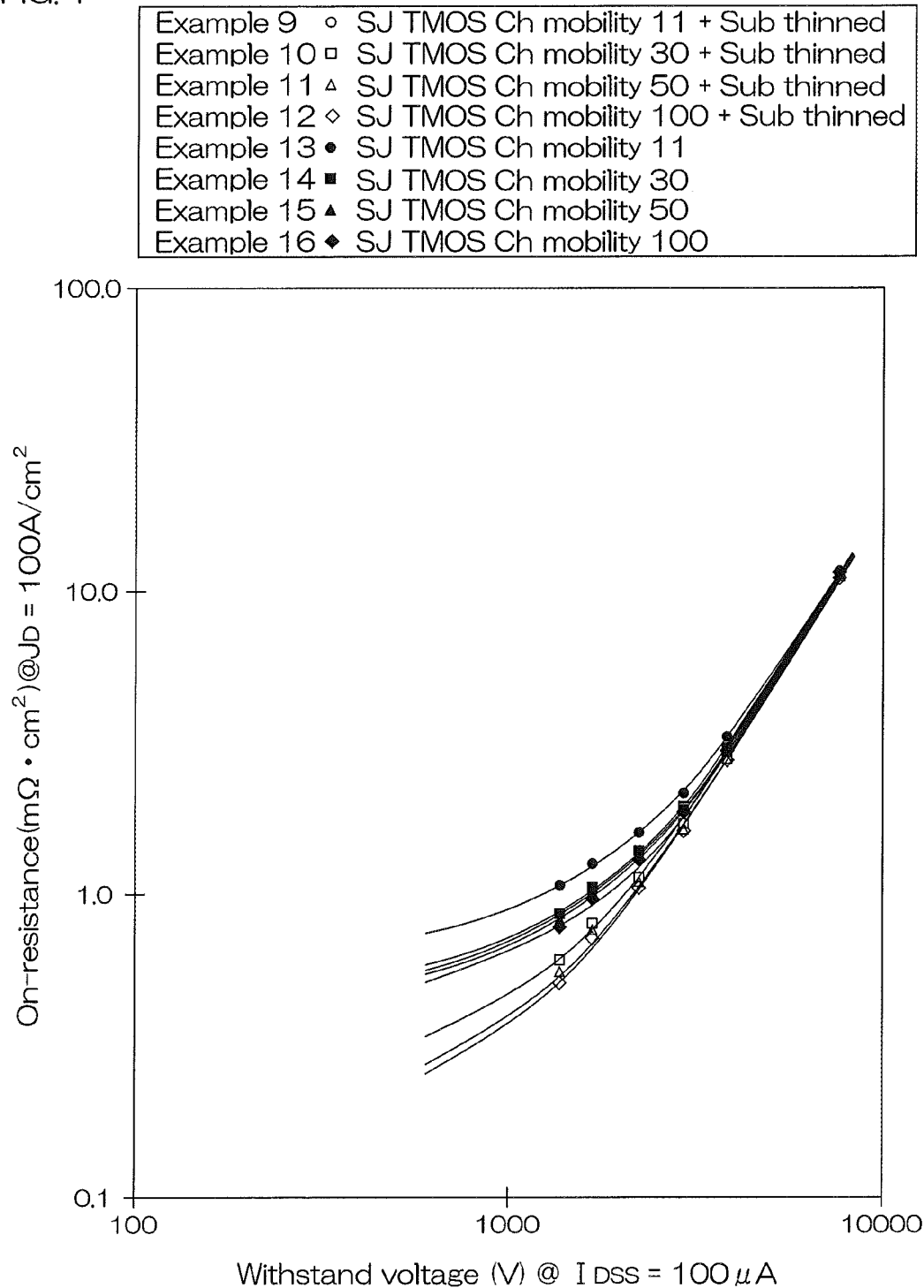
FIG. 7 is a graph (simulation data) showing the relationship between the on-resistance $R_{on}$ and the withstand voltage $V_b$ of the semiconductor device shown in FIGS. 5 and 6.

In FIG. 7, the plotted graphs represent Example 13, 14, 9=15, 16, 10, 11, and 12 in this order from the top.

Among Examples 9 to 16, the graph of Example 13 satisfies $y_4 = 2 \times 10^{-7} x_4^2 - 0.0002 x_4 + 0.9551 \ldots$ (4'), the graph of Example 9 satisfies $y_5 = 2 \times 10^{-7} x_5^2 - 0.0002 x_5 + 0.7001 \ldots$ (5'), the graph of Example 15 satisfies $y_6 = 2 \times 10^{-7} x_6^2 - 0.0002 x_6 + 0.6984 \ldots$ (6'), and the graph of Example 11 satisfies $y_7 = 2 \times 10^{-7} x_7^2 - 0.0002 x_7 + 0.4434 \ldots$ (7').

From the above result, it is found that the semiconductor device 51 according to the second preferred embodiment satisfies the following relational expression (4), which conventional semiconductor devices could not have satisfied.

$$y \leq 2 \times 10^{-7} x^2 - 0.0002x + 0.9551 = y_4 \quad (4)$$

It is also found that if the relational expression (4) is satisfied, it is possible to achieve both reduction in the on-resistance $R_{on}$ and increase in the withstand voltage $V_b$, which have conventionally been in a trade-off relationship.

This makes it possible, in production of products having the same resistance (on-resistance $R_{on}$) as conventional ones, to ensure a sufficient withstand voltage $V_b$ while reducing the area of the active region 9 of the substrate 5 and/or the epitaxial layer 6 to thereby reduce the size of the device and therefore the size of a semiconductor module including the semiconductor device 51. As a result, the number of chips which can be obtained from one substrate 5 can be increased, resulting in an improvement in the manufacturing yield and therefore a reduction in the manufacturing cost can be achieved.

On the other hand, in production of semiconductor devices having the same active area as conventional ones, the on-resistance $R_{on}$ can be reduced relative to conventional ones, resulting in an improvement in the current capacity.

Further, in the semiconductor device 51, since the p-type pillar layer 52 and the n⁻-type drift layer 27 define a super junction structure in the epitaxial layer 6 (Examples 9 to 16), the channel having a mobility of 11 cm²/Vs or higher and the substrate having a thickness of 250 μm or less can satisfy the above relational expression (4).

That is, the channel is only required to have a mobility of 11 cm²/Vs or higher, if increased, and the substrate 5 is only required to have a thickness of 250 μm or less, if thinned, which allows the epitaxial layer 6 to have a relatively large thickness and/or a low impurity concentration, while allowing the substrate 5 to have a practical sufficient strength.

Although the preferred embodiments of the present invention have heretofore been described, the present invention can be embodied in still other forms.

Figure 8:
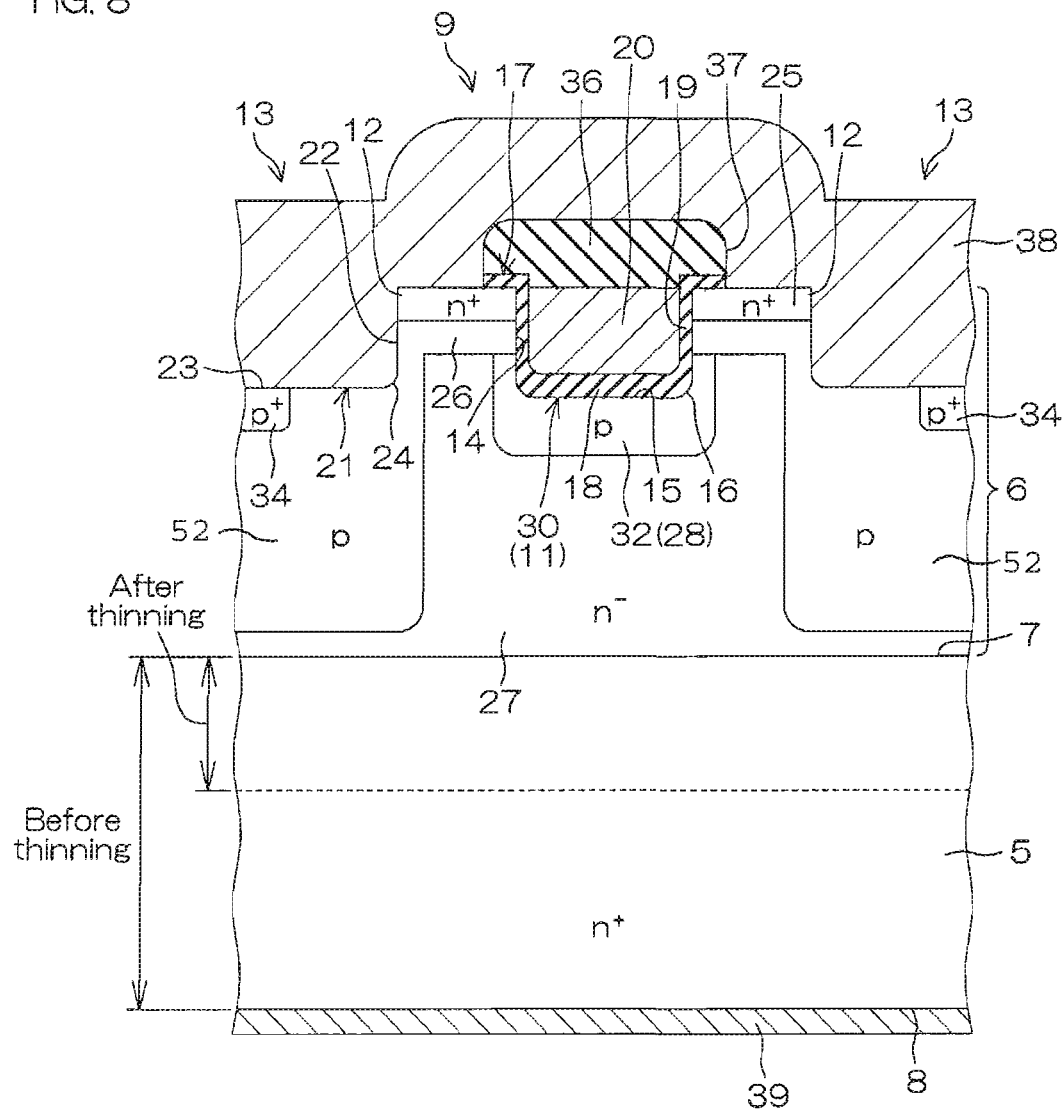
FIG. 8 is a schematic cross-sectional view of a semiconductor device according to a third preferred embodiment of the present invention, showing a cross-section taken along the same line as in FIG. 2.
Figure 9:
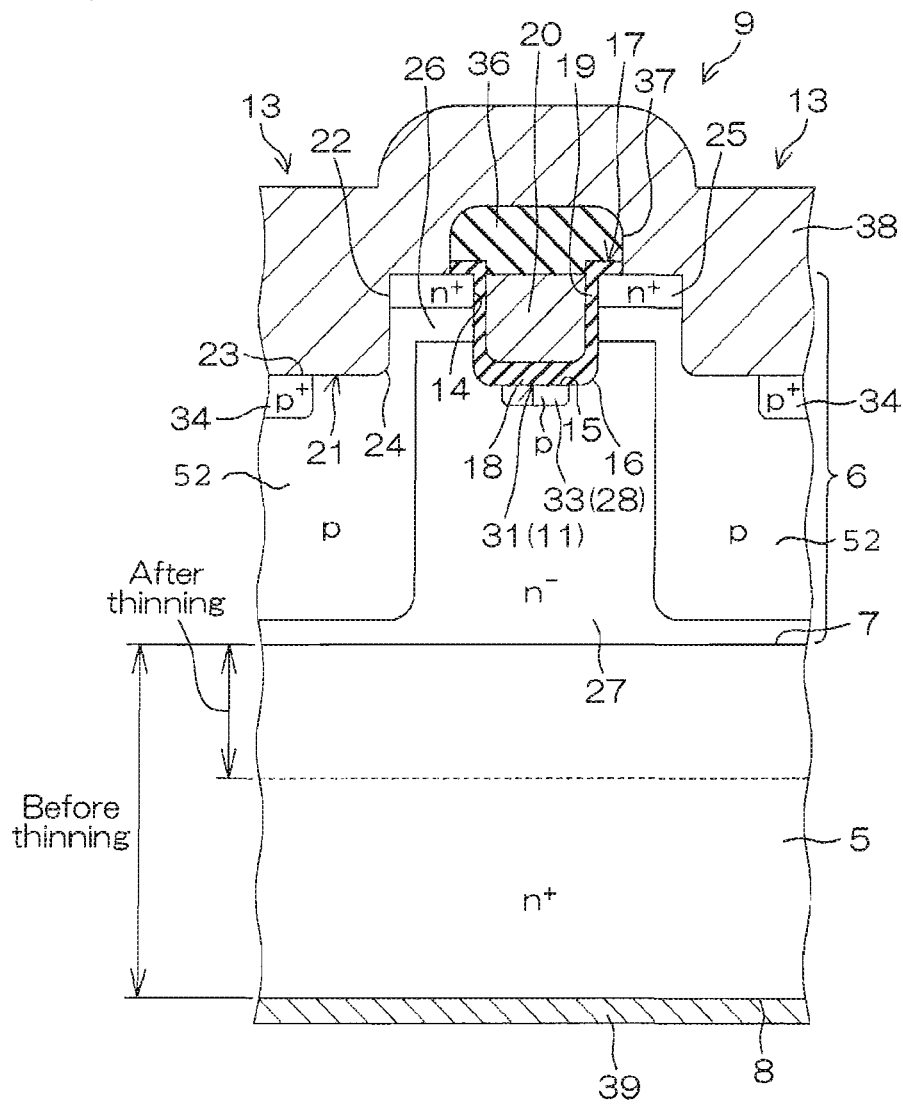
FIG. 9 is a schematic cross-sectional view of the semiconductor device according to the third preferred embodiment of the present invention, showing a cross-section taken along the same line as in FIG. 3.

For example, the present invention may be embodied with a semiconductor device 81 in which the arrangement of the semiconductor device 1 according to the first preferred embodiment and the arrangement of the semiconductor device 51 according to the second preferred embodiment are combined to include a source trench 21 and a p-type pillar layer 52 (super junction structure) as shown in FIGS. 8 and 9. In the semiconductor device 81, the p-type pillar layer 52 is arranged by the source breakdown voltage holding layer 29 according to the first preferred embodiment extending toward the substrate 5 to a depth greater than that of the channel layer 26.

Further, an arrangement may be adopted in which the conductive type of the semiconductor portions of the semiconductor devices 1, 51, and 81 is inverted. For example, in the semiconductor devices 1, 51, and 81, the p-type portions may be n-type and the n-type portions may be p-type.

Furthermore, the unit cells 13 may not be limited to a rectangular parallelepiped shape (quadrangular prism shape), but may have another polygonal prism shape such as a triangular prism shape, a pentagonal prism shape, or a hexagonal prism shape.

The semiconductor power device according to the present invention can be incorporated in, for example, a power module used in an inverter circuit that constitutes a drive circuit arranged to drive an electric motor available as a power source for an electric vehicle (including a hybrid electric vehicle), a train, an industrial robot, and the like, and also in a power module used in an inverter circuit arranged to convert electrical power generated by a solar cell, a wind power generator, and other generators (particularly private electric generators) to be matched with electrical power from commercial power sources.

The above-described preferred embodiments are merely exemplary forms that satisfy the relational expressions (1) and (4) expressing the relationship between the on-resistance $R_{on}$ (y) and the withstand voltage $V_b$ (x) in the present invention, and various design changes to the present invention are possible within the scope as described in the appended claims.

DESCRIPTION OF SIGNS

1 Semiconductor device
2 Source pad
3 Removing region
4 Gate pad
5 Substrate
6 Epitaxial layer
7 First surface (of the substrate)
8 Second surface (of the substrate)
9 Active region
10 Peripheral region
11 Gate trench
12 Corner (of the unit cell)
13 Unit cell
14 Side surface (of the gate trench)
15 Bottom surface (of the gate trench)
16 Corner (of the gate trench)
17 Gate insulating film
18 Bottom portion (of the gate insulating film)
19 Side portion (of the gate insulating film)
20 Gate electrode
21 Source trench
22 Side surface (of the source trench)
23 Bottom surface (of the source trench)
25 Source layer
26 Channel layer
27 Drift layer
28 Gate breakdown voltage holding layer
29 Source breakdown voltage holding layer
30 Intersectional portion (of the gate trench)
31 Linear portion (of the gate trench)
32 First portion (of the gate breakdown voltage holding layer)
33 Second portion (of the gate breakdown voltage holding layer)
34 Channel contact layer
35 Guard ring
36 Interlayer insulating film
37 Contact hole
38 Source electrode
39 Drain electrode
51 Semiconductor device
52 P-type pillar layer
81 Semiconductor device

The invention claimed is:

1. A semiconductor device comprising:
a first conductive-type SiC substrate having a surface;
a first conductive-type SiC epitaxial layer formed on the surface of the first conductive-type SiC substrate and having a gate trench;
a gate insulating film formed on a side surface and a bottom surface of the gate trench;
a first conductive portion embedded in the gate trench;
a first conductive-type source layer formed such that the source layer is formed on a first surface of the first conductive-type SiC epitaxial layer to define a portion of the side surface of the gate trench;
a second conductive-type channel layer formed such that the channel layer is in contact with the source layer to define a portion of the side surface of the gate trench;
a second conductive-type gate breakdown voltage holding layer formed on the bottom surface of the gate trench such that the second conductive-type gate breakdown voltage holding layer partly extends from the bottom surface of the gate trench along the side surface of the gate trench to contact the channel layer;
a source trench formed in the first conductive-type SiC epitaxial layer such that the source trench is spaced apart from the gate trench as viewed in a first direction perpendicular to the first surface of the first conductive-type SiC epitaxial layer;
a second conductive portion embedded in the source trench; and
a source electrode formed over a region above the first conductive portion to the second conductive portion such that the source electrode is electrically connected to the second conductive portion;
a second conductive-type source breakdown voltage holding layer formed in the first conductive-type SiC epitaxial layer, the source breakdown voltage holding layer connected to the channel layer; and
a second conductive-type channel contact layer formed in a surface portion of the source breakdown voltage holding layer, wherein
a distance from the surface of the first conductive-type SiC substrate to a surface of the source electrode over the first conductive portion is longer than a distance from the surface of the first conductive-type SiC substrate to a surface of the source electrode over the second conductive portion, and
on-resistance $R_{on}$ of the semiconductor device represented by a variable "y" and withstand voltage $V_b$ of the semiconductor device represented by a variable "x" functionally satisfy the following relational expression (1):

$$y \leq 9 \times 10^{-7} x^2 - 0.0004x + 0.7001 \tag{1}$$

wherein $x \geq 300$, $y \geq 0.25$ in the relational expression (1).

2. The semiconductor device according to claim 1, wherein the channel layer is capable of making a channel with a mobility of 11 cm²Vs or higher, and the first conductive-type SiC substrate has a thickness of 100 μm or less.

3. The semiconductor device according to claim 1, wherein the on-resistance $R_{on}$ and the withstand voltage $V_b$ satisfy the following relational expression (2):

$$y \leq 9 \times 10^{-7} x^2 - 0.0004x + 0.6984 \qquad (2).$$

4. The semiconductor device according to claim 3, wherein the channel layer is capable of making a channel with a mobility of 50 cm²/Vs or higher, and the first conductive-type SiC substrate has a thickness of 250 μm or less.

5. The semiconductor device according to claim 1, wherein the on-resistance $R_{on}$ and the withstand voltage $V_b$ satisfy the following relational expression (3):

$$y \leq 9 \times 10^{-7} x^2 - 0.0004x + 0.4434 \qquad (3).$$

6. The semiconductor device according to claim 5, wherein the channel layer is capable of making a channel with a mobility of 50 cm²/Vs or higher, and the first conductive-type SiC substrate has a thickness of 100 μm or less.

7. The semiconductor device according to claim 1, wherein the source breakdown voltage holding layer includes a pillar layer such that the pillar layer extends from the channel layer toward a second surface of the first conductive-type SiC epitaxial layer.

8. The semiconductor device according to claim 1, wherein
the source breakdown voltage holding layer is formed from a bottom surface of the source trench through a side surface of the source trench to the channel layer.

9. The semiconductor device according to claim 1, further comprising a first conductive-type drift layer formed such that the drift layer is in contact with the channel layer to define the bottom surface of the gate trench.

* * * * *